US007823017B2

(12) United States Patent
Bueti et al.

(10) Patent No.: US 7,823,017 B2
(45) Date of Patent: Oct. 26, 2010

(54) STRUCTURE FOR TASK BASED DEBUGGER (TRANSACTION-EVENT-JOB-TRIGGER)

(75) Inventors: Serafino Bueti, Waterbury, VT (US); Kenneth J. Goodnow, Essex Junction, VT (US); Todd E. Leonard, Williston, VT (US); Gregory J. Mann, Winfield, IL (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/050,982

(22) Filed: Mar. 19, 2008

(65) Prior Publication Data

US 2008/0215923 A1  Sep. 4, 2008

Related U.S. Application Data

(63) Continuation-in-part of application No. 11/461,793, filed on Aug. 2, 2006, now Pat. No. 7,594,140.

(51) Int. Cl.
*G06F 11/00* (2006.01)

(52) U.S. Cl. .............................. 714/30; 714/31; 714/45

(58) Field of Classification Search .................. 714/30, 714/31, 34, 39, 45
See application file for complete search history.

(56) References Cited

U.S. PATENT DOCUMENTS

| | | | |
|---|---|---|---|
| 5,425,036 A * | 6/1995 | Liu et al. ..................... | 714/735 |
| 6,115,763 A | 9/2000 | Douskey et al. | |
| 6,332,210 B1 | 12/2001 | Barkataki et al. | |
| 6,430,707 B1 | 8/2002 | Matthews et al. | |
| 6,567,933 B1 | 5/2003 | Swoboda et al. | |
| 6,678,645 B1 * | 1/2004 | Rajsuman et al. ............. | 703/20 |
| 7,080,283 B1 | 7/2006 | Songer et al. | |
| 7,434,182 B2 | 10/2008 | Brinson et al. | |
| 7,444,546 B2 | 10/2008 | Kimmelman et al. | |
| 2004/0254779 A1 * | 12/2004 | Wang et al. ................... | 703/27 |
| 2005/0102572 A1 | 5/2005 | Oberlaender | |
| 2005/0193254 A1 | 9/2005 | Yee | |
| 2005/0193276 A1 | 9/2005 | Kang et al. | |
| 2008/0127216 A1 | 5/2008 | Bueti et al. | |
| 2008/0222333 A1 | 9/2008 | Barry et al. | |

OTHER PUBLICATIONS

Mann, et al., U.S. Appl. No. 11/461,793, BUR920060036US1, Office Action Communication, Nov. 6, 2008, 12 Pages.
Bueti, et al., U.S. Appl. No. 11/461,793, BUR920060036US1, Office Action Communication, May 5, 2009, 11 Pages.

* cited by examiner

*Primary Examiner*—Philip Guyton
(74) *Attorney, Agent, or Firm*—Gibb I.P. Law Firm, LLC; Michael J. LeStrange, Esq

(57) ABSTRACT

Disclosed is a design structure for an apparatus for a task based debugger (transaction-event-job-trigger). More specifically, an integrated event monitor for a SOC comprises functional cores each having a functional debug logic element. The cores are connected to an interconnect structure that links the functional debug logic elements. Each functional debug logic element is specifically dedicated to a function of its corresponding core, wherein the functional debug logic elements generate a table of function-specific system events. The system events are function-specific with respect to an associated core, wherein the system events include transaction events, controller events, processor events, interconnect structure arbiter events, interconnect interface core events, high speed serial link core events, and/or codec events.

14 Claims, 8 Drawing Sheets

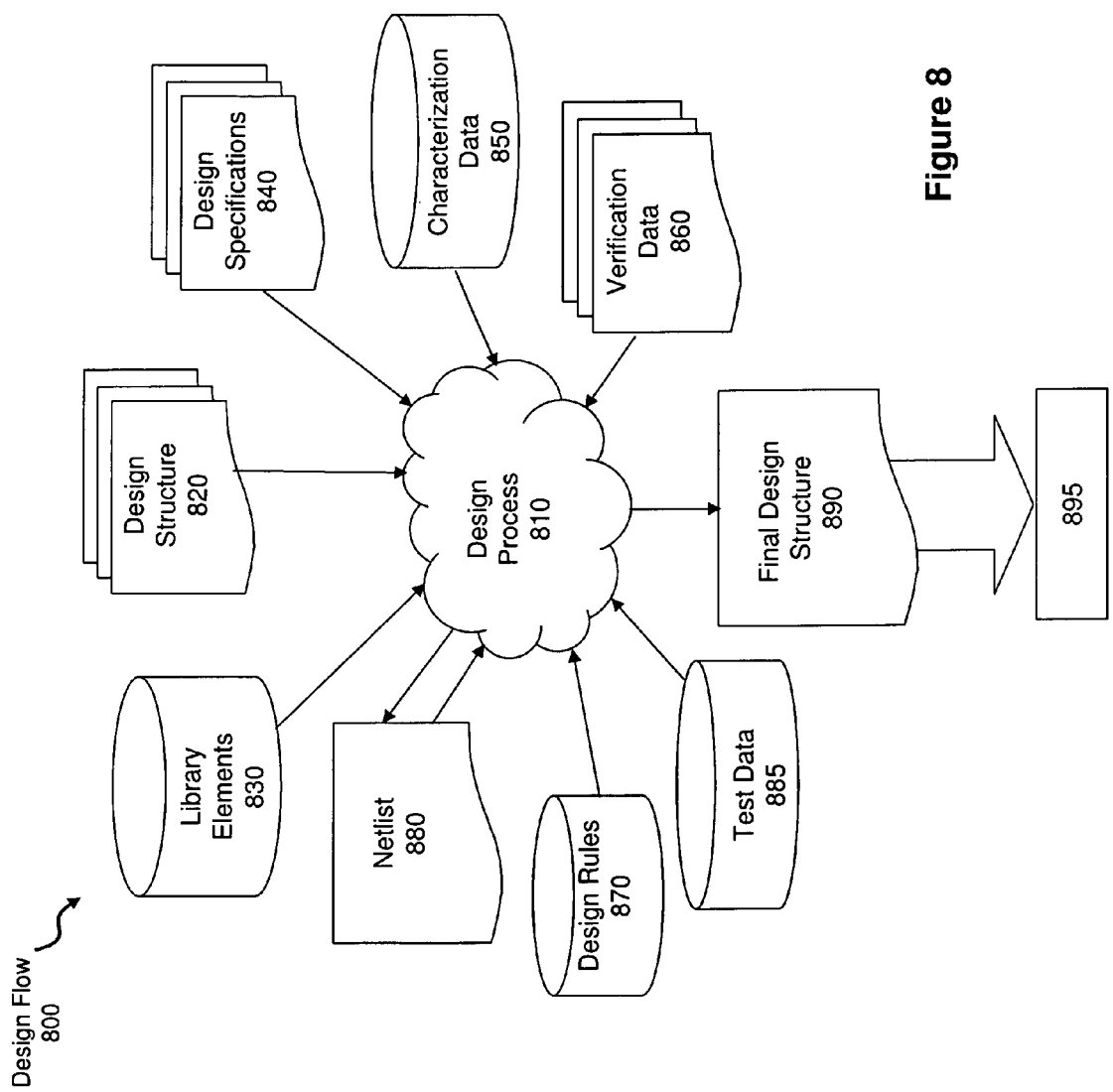

STRUCTURE FOR TASK BASED DEBUGGER (TRANSACTION-EVENT-JOB-TRIGGER)

CROSS-REFERENCE TO RELATED APPLICATIONS

This application is a Continuation-In-Part of U.S. application Ser. No. 11/461,793 filed Aug. 2, 2006, the complete disclosure of which, in its entirety, is herein incorporated by reference.

BACKGROUND

1. Field of the Invention

The embodiments of the invention provide a design structure for an apparatus, method, etc. for a task based debugger (transaction-event-job-trigger).

2. Description of the Related Art

As system-on-a-chip (SOC) based integrated circuit (IC) design increases in functional capacity and complexity, the need for effective system level debug increases proportionally. Many IC design methodologies assume complete verification of subcomponents used (processors, bridges/switches, endpoint cores, and memories). While complete verification of comprising subcomponents may exist for any given SOC, this does not directly imply the completeness of verification of the complete system. Often what remains to be verified is that the subcomponents themselves interact in a correct manner. Various cores are developed by different teams, and sometimes different companies. Trace data from inside of the core is often meaningless to the system-level engineer.

The growth in complexity and size of SOC chips is outstripping the growth in simulation technologies. It is very difficult to simulate the entire functional scope of an SOC implementation, and IC's are manufactured without complete verification. Hardware level debug work may need to be accomplished after manufacture of the original design. Problems discovered at this stage need not necessitate a silicon-based fix. With fully verified cores and methodologies to ensure correct connection of cores at the system level, many problems reduce to software code or software-base configuration of the system. The task at hand in hardware debug is to identify the problem.

Hardware debug could be implemented in such a manner that a cycle-for-cycle history over an arbitrary number of cycles of every latch in the chip could be recovered and analyzed. This is difficult, as it would necessitate too great of storage for all of that information, or require too great of off-chip bandwidth to move the information. Previous debug methods and devices focus on recovery of the current state of the various devices in the on-chip system. However, these methods and devices do not provide any sort of history to indicate how the chip arrived in the current state. What is needed is an architecture through which enough information about the real-time operation of the SOC can be extracted with a minimum of storage/bandwidth. What is also needed is a means for accomplishing system information gathering such that a history of system operation can be produced for debug analysis.

SUMMARY

The embodiments of the invention provide a design structure for an apparatus, method, etc. for a task based debugger (transaction-event-job-trigger). More specifically, an integrated event monitor for a SOC comprises functional cores each having a functional debug logic element. The cores are connected to an interconnect structure that links the functional debug logic elements. Each functional debug logic element is specifically dedicated to a function of its corresponding core, wherein the functional debug logic elements generate a table of function-specific system events. The system events are function-specific with respect to an associated core, wherein the system events include transaction events, controller events, processor events, interconnect structure arbiter events, interconnect interface core events, high speed serial link core events, and/or codec events.

Additionally, a controller connected to the cores is provided, wherein the controller captures the system events in a chronological sequence from the functional debug logic elements. Further, the controller identifies a debug event from one or more cores and instructs the cores to cease capturing of the system events. The controller includes writing control registers to turn on and off recording of different types of system events for the cores. Moreover, the cores include core logic blocks comprising the system events, wherein the core logic blocks send the system events to the controller. The controller places timestamps on the system events and sends the system events to the table.

The embodiments of the invention also provide a method for monitoring events on a SOC. The method begins by dedicating a functional debug logic element to a function of a corresponding functional core, wherein the functional debug logic elements are linked via an interconnect structure. Next, function-specific system events are captured in a chronological sequence from the functional debug logic elements via a controller. The method turns the recording of different types of system events on and off for the cores via writing control registers in the controller.

Further, a table of system events that are function-specific with respect to an associated core is generated. The table is generated with system events that include transaction events, controller events, processor events, interconnect structure arbiter events, interconnect interface core events, high speed serial link core events, and/or codec events. Moreover, the system events are sent from core logic blocks within the cores to the controller, wherein the controller places timestamps on the system events and sends the system events to the table. Additionally, the method further includes identifying a debug event from one or more cores and instructing the cores to cease the capturing of the system events.

Accordingly, the embodiments of the invention describe an architecture for a debug system that categorizes and stores various function-specific events for each core in a SOC system. These events include transaction events (read vs. write, transaction length, etc.), significant state machine events (low power entrance/exit, link status change, etc.), processor events (interrupt reception, context switch, etc.), and bus arbiter events (grant change, request status change). These events are stored with time stamps to produce a history of events for use in analysis.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 8 is a flow diagram of a design process used in semiconductor design, manufacture, and/or test.

DETAILED DESCRIPTION OF PREFERRED EMBODIMENTS

Figure 1:
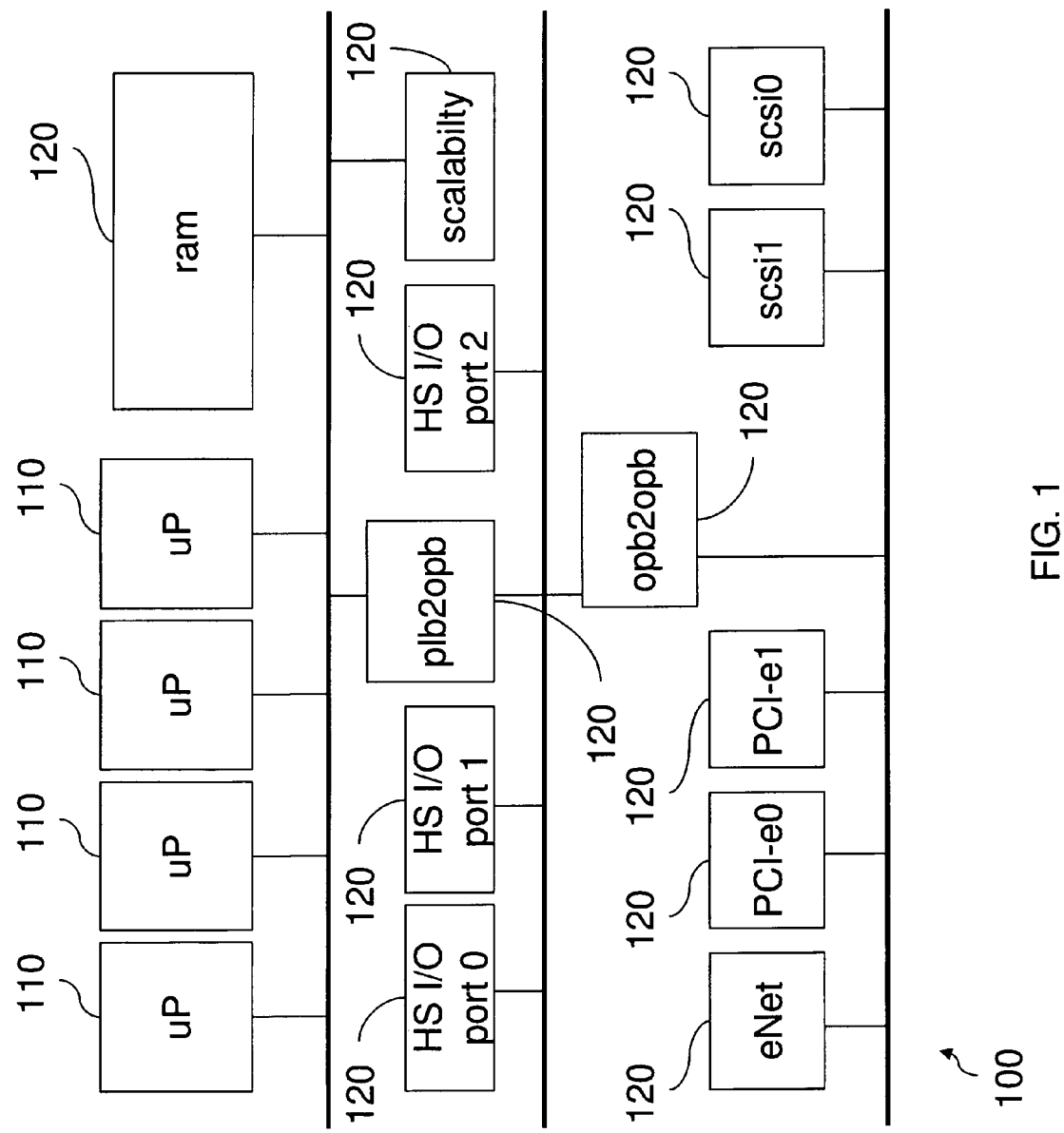
FIG. 1 is a diagram illustrating an example SOC architecture.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention describe an architecture for a debug system that categorizes and stores various function-specific events for each core in a SOC system. These events include transaction events (read vs. write, transaction length, etc.), significant state machine events (low power entrance/exit, link status change, etc.), processor events (interrupt reception, context switch, etc.), and bus arbiter events (grant change, request status change). These events are stored with time stamps to produce a history of events for use in analysis.

FIG. 1 illustrates an example SOC architecture 100. This example SOC includes multiple processors 110 and a hierarchy of interconnect to various cores 120. Each core and processor provides a means to record continuous configurable history of events, either locally in each core or output to global locations. Embodiments herein provide that a debug trigger in the processors or the cores be distributed to all devices, causing the event history to cease recording. After this, the event history can be read out over the system interconnect to an arbitrary port on the SOC.

The events that each device records in its history are function-specific. The following provides example event information for different types of devices in a SOC. Processor events include interrupt events (record time when specific interrupts occurs); exception events (page faults, machine-check errors); context switch events (record time when context switch occurs, can identify context switches with changes in virtual memory map); and, software trigger events (explicitly record time when software instructs). Interconnect structure arbiter events include grant change events (record time when grant changes devices); timeout events (regarding various bus functions); and, device conflict events (record time when two or more device simultaneously request bus, record which devices were competing).

Furthermore, bridge events include arbitration events (when different cores request bus access, who was denied, etc.). High Speed Serial Link core event include link status change events (record time when link status changes, can include arbitration status, i.e. what is it about to do next); power management events (record time when power management change occurs); packet events (record start and end times for packets, length of packets); and, error events (record times of errors for events such as buffer over/underflow, exceeding high water mark). Moreover, bus interface core events include transaction events (record time when transaction on bus begins and ends, length of transaction, etc.); power management state change events; arbitration events (record when bus is granted and how long it has been waiting); and, bus error events (record times of error events). Additionally, codec events (i.e. encryption or compression cores) include processing events (record when starting and stopping data block, how long block is).

Figure 2:
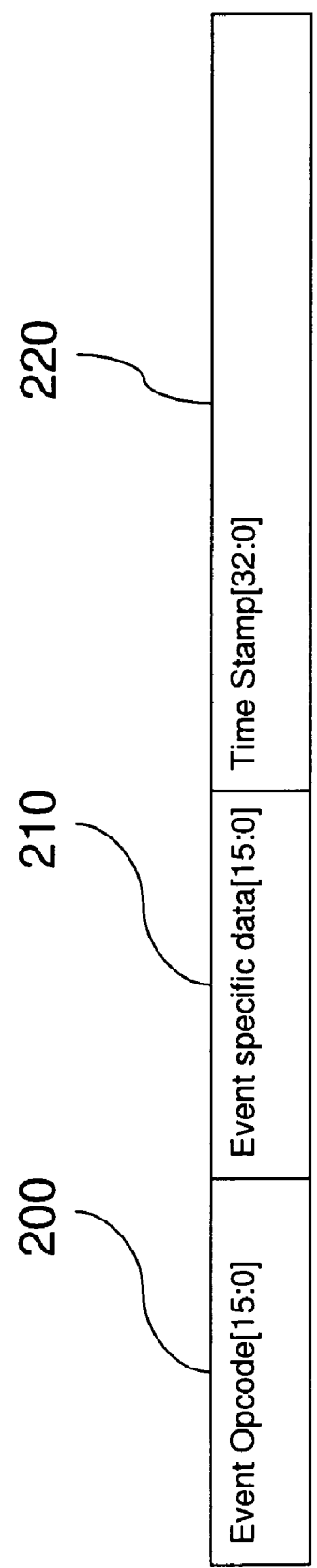
FIG. 2 is a diagram illustrating an example event table entry.

Each event's information is recorded into an entry in a table. There is an individual table in each core. The entries of the table are written into in the order in which events occur. Each entry is broken down as illustrated in FIG. 2, which includes event opcode 200, event specific data 210, and time stamp 220.

If the table fills with data, the oldest entries are overwritten. If an entry is still exists when the time stamp wraps back to the entries value, the entry is removed. This prevents old events from being seen as having occurred more recently.

Figure 3:
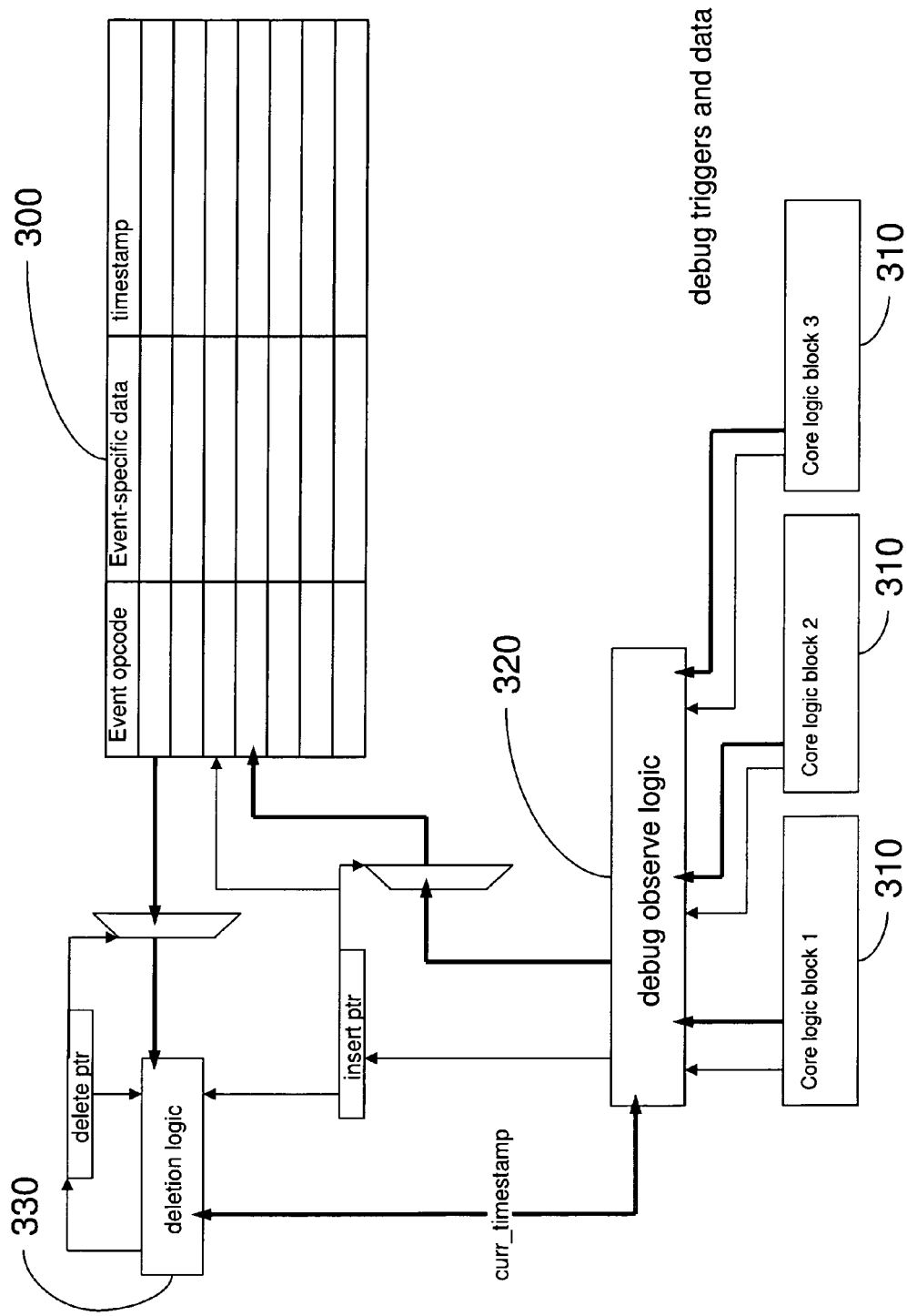
FIG. 3 is a diagram illustrating logic used to control the event table.

FIG. 3 illustrates the logic used to control the event table 300. Debug triggers and data are sourced by specific core logic blocks 310 inside of the core (i.e., core logic blocks 1, 2, and 3) and sent to the observe logic 320. The core logic blocks 310 are also referred to herein as the "functional debug logic elements"; and, the observe logic 320 is also referred to herein as the "controller", the "state machine", the "debug observe logic", or the "centralized debug control logic block". The observe logic 320 records the timestamp for each core logic block 310 as the events are signaled, and then acknowledges the event from the core logic as it processes it and then updates the insert pointer and table entry with the opcode, data, and timestamp. The deletion logic 330 looks for table overflow, deleting the oldest entry, as well as stale-entry deletion.

When a debug event is triggered somewhere in the SOC, the timestamp of the debug trigger is recorded. The trigger is then distributed across the chip to every table. Unlike debug architectures which capture the state of the entire chip, this propagation need not be accomplished in one cycle. Once a table sees that a debug trigger has occurred, it stops writing entries into the table, and prevents the deletion of stale entries. This effectively "freezes" the history. Once all of the tables have been frozen, they can be read out of the chip by any number of means, including scan chains, management interfaces (IIC), or over the normal system interconnect to any port on the chip. Once retrieved, this information can be used to build a chip-wide history of events that can be used to determine the order of events leading to the problem at hand.

Figure 4:
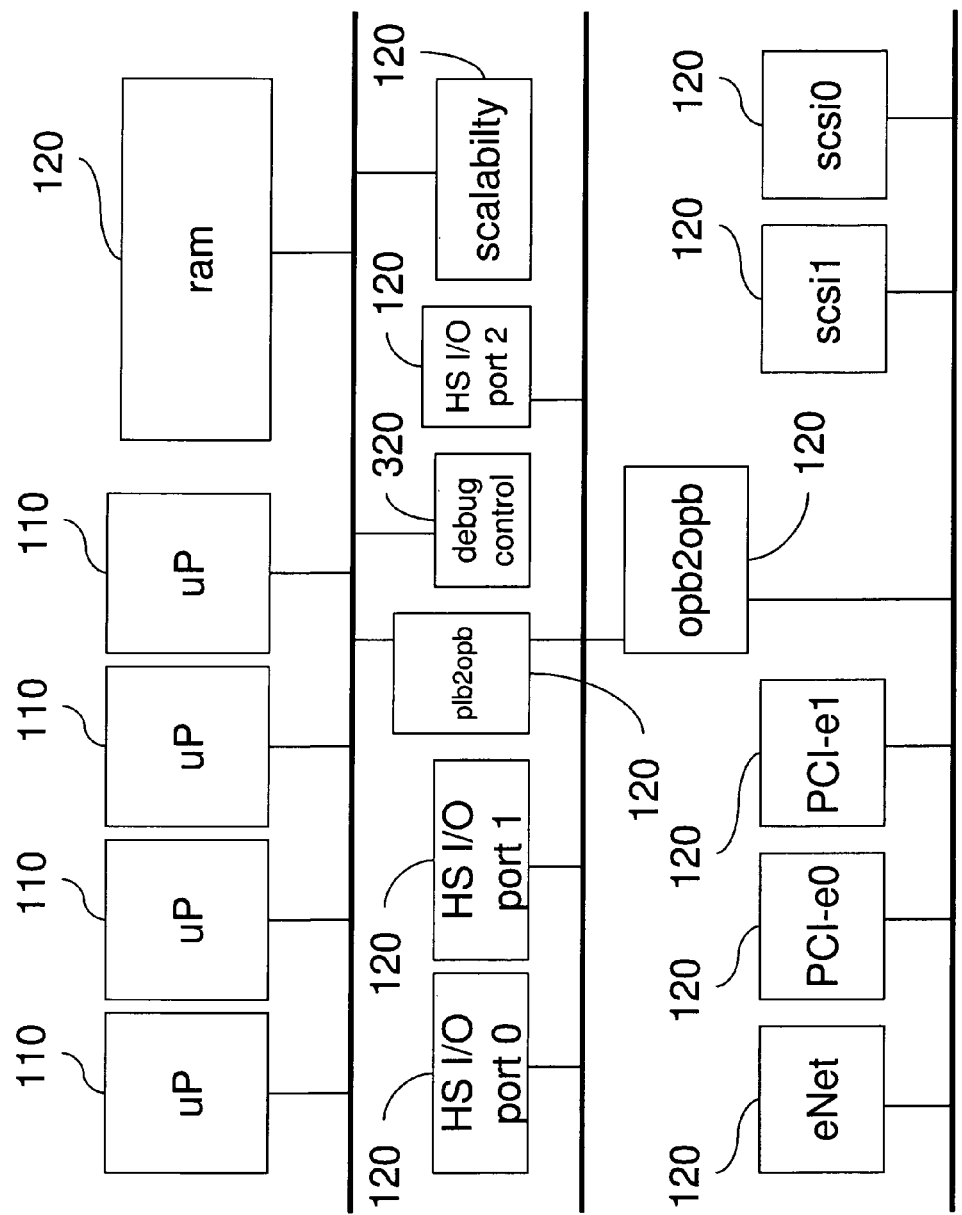
FIG. 4 is a diagram illustrating a SOC implementation with a centralized debug control logic block.

FIG. 4 shows a SOC implementation with the centralized debug control logic block 320. This logic waits until one core 120 triggers a debug event. Once the trigger has been seen, it instructs every core 120 to cease event logging.

Embodiments herein handle asynchronous clock domains by sending the debug trigger and current timestamp from the central SOC event debug clock domain. The same logic exists in the local clock domain, with the addition of a local clock offset. This offset is similar to the global timestamp, but increments on the local clock. This, together with the global timestamp, provides a clearer picture of the event history in the core.

Figure 5:
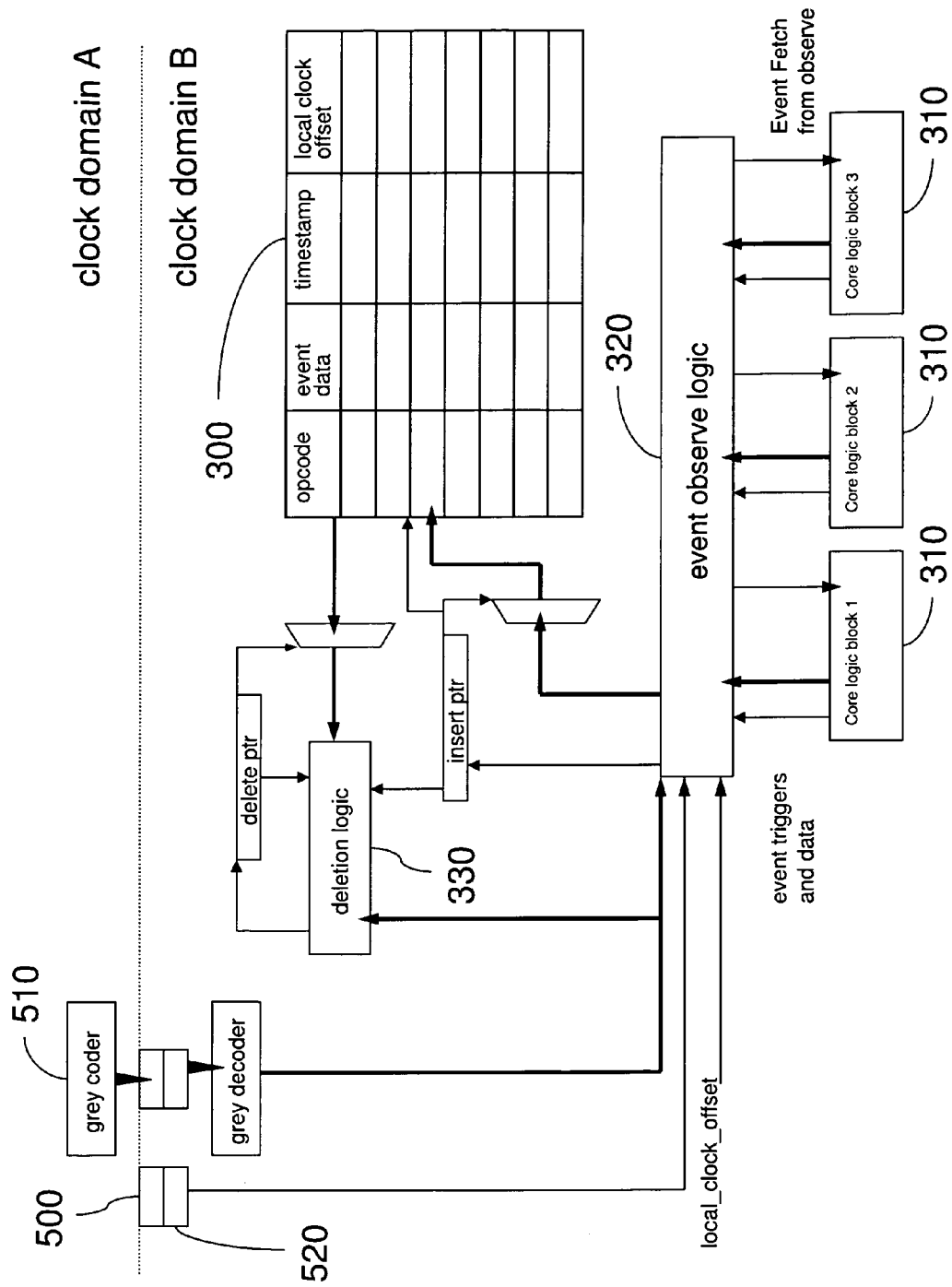
FIG. 5 is a diagram illustrating an implementation of the event table with asynchronous clock domains.

FIG. 5 shows an implementation of the table with asynchronous clock domains. The debug trigger 500 and grey-coded timestamp value 510 are passed to a double latch 520 and passed to the local clock domain. The event recording is accomplished as before, but a local time offset is appended to the table entries. This allows the debug engineer to better piece together the order of events in both clock domains. There may be some uncertainty of when events occurred with respect to timestamp value 510 changes, but this still aids engineers in recovering events.

Recording of various types of events for each core can be turned on and off via writing control registers inside of the event observe logic 320. This enables different types of information to be stored. In some cases one would like to know broadly what is occurring in a core over recent history. In other cases, debug engineers may want to know what a very specific piece of logic or function has been doing over a longer period of time, and would therefore turn off most event recording.

Figure 6:
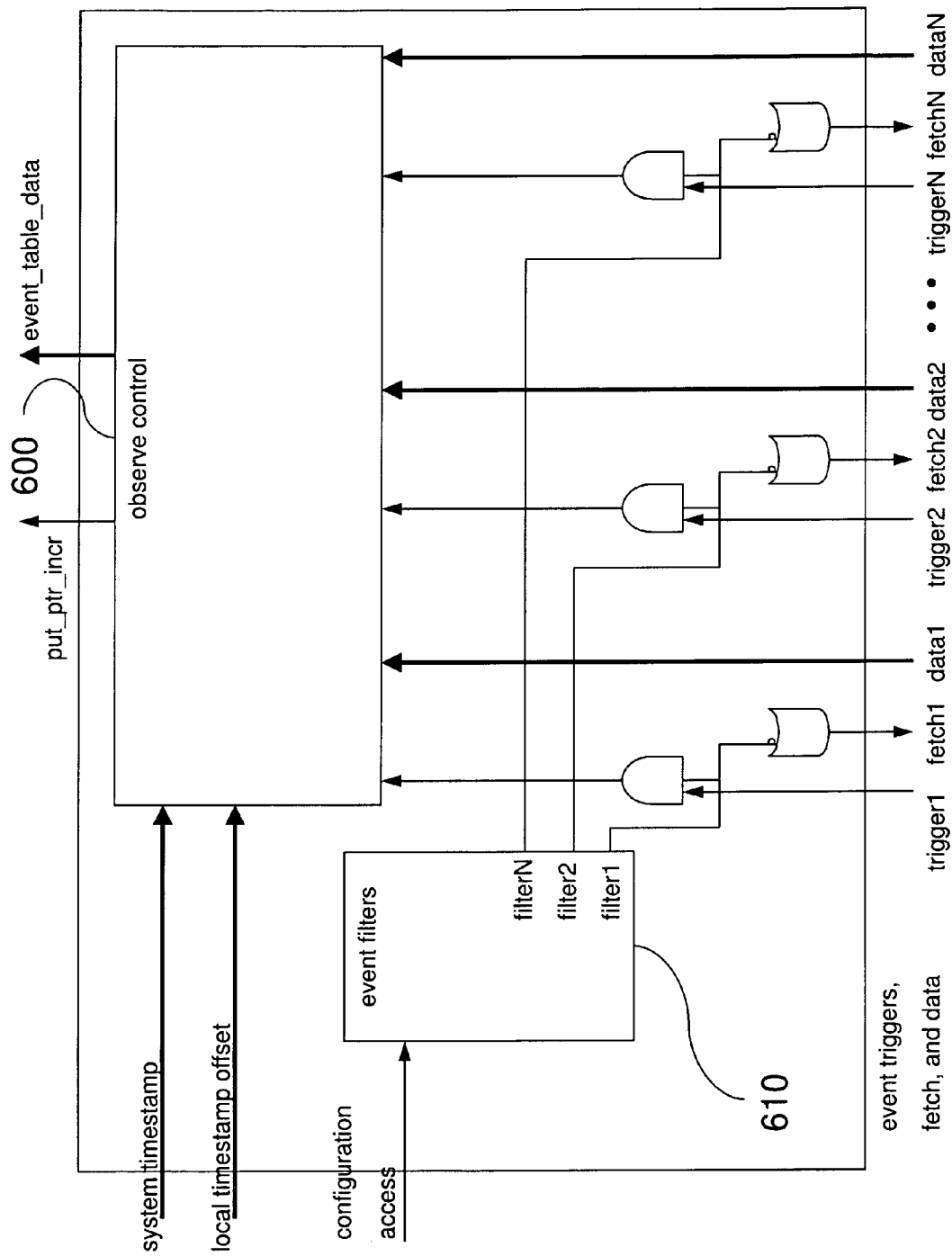
FIG. 6 is a diagram illustrating operation of the event observe logic.

FIG. 6 illustrates the operation of the event observe logic 320. When event triggers come in from various portions of the logic, the observe_control 600 checks the event trigger type against the event filters 610. If it is not configured to record that particular event, it responds to the logic that it is done with the event. If it is configured to record the event, the observe_control 600 will wait until other events have been written out to the table, write this current event, and signal to the logic that it is done with this event.

There are a variety of ways in which data from the event table can be communicated off chip to the engineer for analysis. First, the table can be addressable via the on-chip system bus, and therefore readable by the system. Further, the tables can have a dedicated output, and the information is streamed out from the tables off chip. In this situation there may be a need for the tables to send an identifying tag that indicates which core the table data is coming from. Additionally, the tables can be scanned out via the on-chip scan chains. Data is correlated to the table by the same mechanism scan test data is correlated to specific latches.

Accordingly, by providing a recent history of events, engineers can better find out how the system arrived at invalid or non-optimal states, over schemes providing the current state. There are cases where the right debug trigger is not able to be generated automatically inside of the chip. With this scheme the engineer can manually issue the debug trigger, and while the current state may not reveal any invalid state or problem, the recent history can paint a much clearer picture of the activity. Engineers can additionally track data as it moves from device to device inside of the chip. This helps them in determining where and when problems occur, and can help characterize behaviors across different states and situations.

Furthermore, the creation of a on-chip, automatic history generation (time stamped) allows one to change the information granularity, since the information collected is on the transaction level basis, which is definable (in the "event observe logic").

The embodiments of the invention provide an apparatus, method, etc. for a task based debugger (transaction-event-job-trigger). More specifically, an integrated event monitor for a SOC comprises functional cores each having a functional debug logic element. The cores are connected to an interconnect structure that links the functional debug logic elements. As illustrated in FIG. 1, the SOC architecture 100 includes multiple processors 110 and a hierarchy of interconnect to various cores 120. Each functional debug logic element is specifically dedicated to a function of its corresponding core, wherein the functional debug logic elements generate a table of function-specific system events. The system events are function-specific with respect to an associated core, wherein the system events include transaction events, controller events, processor events, interconnect structure arbiter events, interconnect interface core events, high speed serial link core events, and/or codec events. As illustrated in FIG. 2, each event's information is recorded into an entry in the table, wherein the entries of the table are written into in the order in which events occur. Each entry includes event opcode 200, event specific data 210, and time stamp 220.

Additionally, a controller connected to the cores is provided, wherein the controller captures the system events in a chronological sequence from the functional debug logic elements. As discussed above, if the table fills with data, the oldest entries are over-written. If an entry still exists when the time stamp wraps back to the entries value, the entry is removed. This prevents old events from being seen as having occurred more recently.

Furthermore, the controller identifies a debug event from one or more cores and instructs the cores to cease capturing of the system events. As discussed above, when a debug event is triggered somewhere in the SOC, the timestamp of the debug trigger is recorded. The trigger is then distributed across the chip to every table.

The controller includes writing control registers to turn on and off recording of different types of system events for the cores. As discussed above, this enables different types of information to be stored. In some cases one would like to know broadly what is occurring in a core over recent history. In other cases, debug engineers may want to know what a very specific piece of logic or function has been doing over a longer period of time, and would therefore turn off most event recording.

Moreover, the cores include core logic blocks comprising the system events, wherein the core logic blocks send the system events to the controller. The controller places timestamps on the system events and sends the system events to the table. As illustrated in FIG. 3, data is sourced by the core logic blocks 310 inside of the core and sent to the controller 320. The controller 320 records the timestamp for each core logic block 310 as the events are signaled, and then acknowledges the event from the core logic as it processes it and then updates the insert pointer and table entry with the opcode, data, and timestamp.

The embodiments of the invention also provide a method for monitoring events on a SOC. The method begins by dedicating a functional debug logic element to a function of a corresponding functional core, wherein the functional debug logic elements are linked via an interconnect structure. As illustrated in FIG. 1, the SOC architecture 100 includes multiple processors 110 and a hierarchy of interconnect to various cores 120. Next, function-specific system events are captured in a chronological sequence from the functional debug logic elements via a controller. As discussed above, if the table fills with data, the oldest entries are over-written. The method turns the recording of different types of system events on and off for the cores via writing control registers in the controller. As discussed above, this enables different types of information to be stored.

Further, a table of system events that are function-specific with respect to an associated core is generated. The table is generated with system events that include transaction events, controller events, processor events, interconnect structure arbiter events, interconnect interface core events, high speed serial link core events, and/or codec events. As illustrated in FIG. 2, each entry includes event opcode 200, event specific data 210, and time stamp 220. Moreover, the system events are sent from core logic blocks within the cores to the controller, wherein the controller places timestamps on the system events and sends the system events to the table. As illustrated in FIG. 3, the controller 320 records the timestamp for each core logic block 310 as the events are signaled, and then acknowledges the event from the core logic as it processes it and then updates the insert pointer and table entry with the opcode, data, and timestamp.

Additionally, the method further includes identifying a debug event from one or more cores and instructing the cores to cease the capturing of the system events. As discussed above, once a table sees that a debug trigger has occurred, it stops writing entries into the table, and prevents the deletion of stale entries. This effectively "freezes" the history. Once all of the tables have been frozen, they can be read out of the chip by any number of means, including scan chains, management interfaces (IIC), or over the normal system interconnect to any port on the chip. Once retrieved, this information can be used to build a chip-wide history of events that can be used to determine the order of events leading to the problem at hand.

Figure 7:
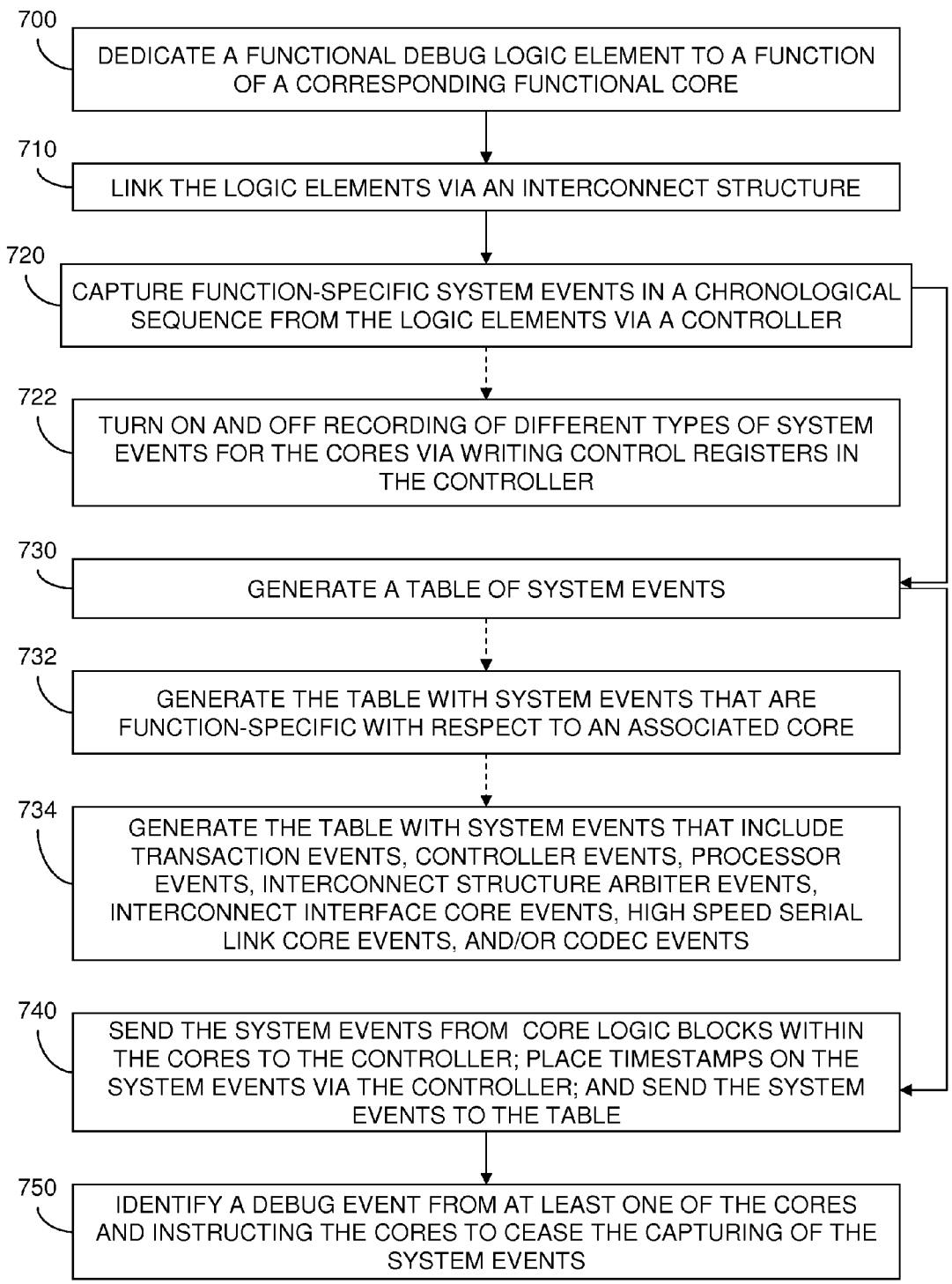
FIG. 7 is a flow diagram illustrating a method for a task based debugger.

FIG. 7 illustrates a flow diagram of a method for a task based debugger. In item 700, the method begins by dedicating a functional debug logic element to a function of a corresponding functional core. Next, in item 710, the logic elements are linked via an interconnect structure. As illustrated in FIG. 1, the SOC architecture 100 includes multiple processors 110 and a hierarchy of interconnect to various cores 120.

In item 720, function-specific system events are captured in a chronological sequence from the logic elements via a controller. As discussed above, if the table fills with data, the oldest entries are over-written. If an entry is still exists when the time stamp wraps back to the entries value, the entry is removed. This prevents old events from being seen as having occurred more recently. The method includes turning on and off recording of different types of system events for the cores in item 722 via writing control registers in the controller. As discussed above, this enables different types of information to be stored. In some cases one would like to know broadly what is occurring in a core over recent history. In other cases, debug engineers may want to know what a very specific piece of logic or function has been doing over a longer period of time, and would therefore turn off most event recording.

Furthermore, the method generates a table of system events (item 730), including generating the table with system events that are function-specific with respect to an associated core (item 732). The table is also generated with system events that include transaction events, controller events, processor events, interconnect structure arbiter events, interconnect interface core events, high speed serial link core events, and/ or codec events (item 734). As illustrated in FIG. 2, each event's information is recorded into an entry in the table, wherein the entries of the table are written into in the order in which events occur. Each entry includes event opcode 200, event specific data 210, and time stamp 220.

Additionally, in item 740, the method includes sending the system events from core logic blocks within the cores to the controller; placing timestamps on the system events via the controller; and sending the system events to the table. As illustrated in FIG. 3, data is sourced by the core logic blocks 310 inside of the core and sent to the controller 320. The controller 320 records the timestamp for each core logic block 310 as the events are signaled, and then acknowledges the event from the core logic as it processes it and then updates the insert pointer and table entry with the opcode, data, and timestamp. The method further includes, in item 750, identifying a debug event from at least one of the cores instructing the cores to cease the capturing of the system events. As discussed above, when a debug event is triggered somewhere in the SOC, the timestamp of the debug trigger is recorded. The trigger is then distributed across the chip to every table.

FIG. 8 shows a block diagram of an exemplary design flow 800 used for example, in semiconductor design, manufacturing, and/or test. Design flow 800 may vary depending on the type of IC being designed. For example, a design flow 800 for building an application specific IC (ASIC) may differ from a design flow 800 for designing a standard component or from a design from 800 for instantiating the design into a programmable array, for example a programmable gate array (PGA) or a field programmable gate array (FPGA) offered by Altera® Inc. or Xilinx® Inc. Design structure 820 is preferably an input to a design process 810 and may come from an IP provider, a core developer, or other design company or may be generated by the operator of the design flow, or from other sources. Design structure 820 comprises an embodiment of the invention as shown in FIGS. 1-6 in the form of schematics or HDL, a hardware-description language (e.g., Verilog, VHDL, C, etc.). Design structure 820 may be contained on one or more machine readable medium. For example, design structure 820 may be a text file or a graphical representation of an embodiment of the invention as shown in FIGS. 1-6. Design process 810 preferably synthesizes (or translates) an embodiment of the invention as shown in FIGS. 1-6 into a netlist 880, where netlist 880 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Design process 810 preferably translates an embodiment of the invention as shown in FIGS. 1-6, along with any additional integrated circuit design or data (if applicable), into a second design structure 890. Design structure 890 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 890 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-6. Design structure 890 may then proceed to a stage 895 where, for example, design structure 890: proceeds to tape-out, is released to manufacturing, is released to a mask house, is sent to another design house, is sent back to the customer, etc.

Accordingly, the embodiments of the invention describe an architecture for a debug system that categorizes and stores various function-specific events for each core in a SOC system. These events include transaction events (read vs. write, transaction length, etc.), significant state machine events (low power entrance/exit, link status change, etc.), processor events (interrupt reception, context switch, etc.), and bus arbiter events (grant change, request status change). These events are stored with time stamps to produce a history of events for use in analysis.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A design structure tangibly embodied in a machine readable medium for designing, manufacturing, or testing an integrated circuit, the design structure comprising an integrated event monitor for a system-on-a-chip (SOC), comprising:
   a plurality of functional cores each comprising one of a plurality of functional debug logic elements each of which is specifically dedicated to a function of a corresponding one of said cores, wherein each of said functional debug logic elements is adapted to generate a table of function-specific system events;
   an interconnect structure connected to said cores, wherein said interconnect structure is adapted to link said functional debug logic elements; and
   a controller connected to said cores, wherein said controller is adapted to capture said system events in a chronological sequence from each of said functional debug logic elements;
   wherein each of said cores comprises a plurality of core logic blocks comprising said system events,
   wherein said core logic blocks are adapted to send said system events to said controller, and
   wherein said controller is adapted to place timestamps on said system events and send said system events to said table.

2. The design structure of claim 1, wherein said controller is further adapted to identify a debug event from at least one of said cores and instruct each of said cores in said SOC to cease said capture of said system events.

3. The design structure of claim 1, wherein said controller comprises writing control registers adapted to turn on and off recording of different types of said system events for each of said cores.

4. The design structure of claim 1, wherein said system events are function-specific with respect to an associated one of said cores.

5. The design structure of claim 1, wherein said system events comprise at least one of transaction events, controller events, processor events, interconnect structure arbiter events, interconnect interface core events, high speed serial link core events, and codec events.

6. The design structure of claim 1, wherein the design structure comprises a netlist.

7. The design structure of claim 1, wherein the design structure resides on storage medium as a data format used for the exchange of layout data of integrated circuits.

8. The design structure of claim 1, all the limitations of which are incorporated herein by reference, wherein the design structure resides in a programmable gate array.

9. A design structure tangibly embodied in a machine readable medium for designing, manufacturing, or testing an integrated circuit, the design structure comprising an integrated event monitor for a system-on-a-chip (SOC), comprising:
   a plurality of functional cores each comprising one of a plurality of functional debug logic elements each of which is specifically dedicated to a function of a corresponding one of said cores, wherein each of said functional debug logic elements is adapted to generate a table of function-specific system events;
   an interconnect structure connected to said cores, wherein said interconnect structure is adapted to link said functional debug logic elements; and
   a controller connected to said cores, wherein said controller is adapted to capture said system events in a chronological sequence from each of said functional debug logic elements, identify a debug event from at least one of said cores, and instruct each of said cores in said SOC to cease said capture of said system events;
   wherein each of said cores comprises a plurality of core logic blocks comprising said system events,
   wherein said core logic blocks are adapted to send said system events to said controller, and
   wherein said controller is adapted to place timestamps on said system events and send said system events to said table.

10. The design structure of claim 9, wherein said controller comprises writing control registers adapted to turn on and off recording of different types of said system events for each of said cores.

11. The design structure of claim 9, wherein said system events are function-specific with respect to an associated one of said cores.

12. The design structure of claim 9, wherein the design structure comprises a netlist.

13. The design structure of claim 9, wherein the design structure resides on storage medium as a data format used for the exchange of layout data of integrated circuits.

14. The design structure of claim 9, all the limitations of which are incorporated herein by reference, wherein the design structure resides in a programmable gate array.

* * * * *